United States Patent [19]

Steele

[11] Patent Number: 5,471,155
[45] Date of Patent: Nov. 28, 1995

[54] USER PROGRAMMABLE PRODUCT TERM WIDTH EXPANDER

[75] Inventor: Randy C. Steele, Folsom, Calif.

[73] Assignee: Intel Corporation, Santa Clara, Calif.

[21] Appl. No.: 293,280

[22] Filed: Aug. 19, 1994

Related U.S. Application Data

[63] Continuation of Ser. No. 42,086, Mar. 31, 1993, abandoned.

[51] Int. Cl.⁶ .................................................. H03K 19/177
[52] U.S. Cl. .................................................. 326/39; 326/41
[58] Field of Search ...................... 307/465, 469, 307/452, 443, 465.1; 326/39, 41, 44–45, 47, 49–50, 21

[56] References Cited

U.S. PATENT DOCUMENTS

| | | | |
|---|---|---|---|
| 4,488,246 | 12/1984 | Brice | 307/465 |
| 4,697,241 | 9/1987 | Lavi | 307/465 |
| 4,785,746 | 7/1988 | Birkner et al. | 307/465 |
| 4,967,107 | 10/1990 | Kaplinsky | 307/465 |
| 5,130,574 | 7/1992 | Shen et al. | 307/465 |
| 5,291,079 | 3/1994 | Goetting | 307/465 |

Primary Examiner—Edward P. Westin
Assistant Examiner—Jon Santamauro
Attorney, Agent, or Firm—Blakely, Sokoloff, Taylor & Zafman

[57] ABSTRACT

A product term allocation arrangement in which each of a first plurality of input conductors may be programmably joined to a first plurality of output conductors and to a first plurality of AND gates, a second plurality of input conductors may be programmably joined to a second plurality of output conductors and to a second plurality of AND gates, apparatus which may be selected to perform either an AND or an OR function connected to receive input signals from one of the first plurality of AND gates and one of the second plurality of AND gates, and a plurality of OR gates connected to receive input signals from a selected number of the apparatus connected to receive input signals from one of the first plurality of AND gates and one of the second plurality of AND gates.

39 Claims, 5 Drawing Sheets

USER PROGRAMMABLE PRODUCT TERM WIDTH EXPANDER

This application is a Continuation of U.S. application Ser. No. 08/042,086 filed Mar. 31, 1993, now abandoned.

BACKGROUND OF THE INVENTION

1. Field of the Invention

This invention relates to computer systems and, more particularly, to methods and apparatus for providing a user programmable product term width expander.

2. History of the Prior Art

Programmable logic arrays (PLAs) are arrays of gates which allow a plurality of input values to be manipulated in accordance with various Boolean functions. Essentially, such an array comprises a first series of input conductors each of which may carry a binary input value and a second series of input conductors each of which may carry the inverse of the binary input value carried by an associated one of the first series of input conductors. These first and second input conductors are selectively joined to a third series of conductors each of which is connected to a plurality of AND gates, one input conductor to each one of the third series of conductors. In a PLA, the output of each AND gate (a product term) is available at the input to each of a plurality of OR gates. Since any one of the input conductors may be selectively joined to each of the third series of conductors, all of the input conductors are available to each of the AND gates in a PLA. By connecting various AND gate outputs (product terms) to various OR gates, a particular Boolean function which is the sum of the products terms produced by the AND gates may be furnished at the output of any OR gate. The Boolean output function provided at the output of each of the OR gates is programmable by a user at the manufacturing stage by programming the connections to be made between the input conductors and the conductors of the third series through the particular devices (EPROM cells, fuses, flash EEPROM cells) used in the PLA.

Because the various Boolean functions provided by a PLA are entirely programmable, the speed of operation is slowed to some extent. This occurs because all of the inputs must be available to all of the AND gates, and all of the AND gate outputs must be available to all of the OR gates. Improvements to overcome this loss of speed gave rise to the programmable array logic (PAL®) in which inputs to the OR gates which sum the product term outputs of the various AND gates are limited in number and hardwired (and are therefore not programmable). Reducing the programmability increases the speed of the array but reduces the options available and limits the number of inputs to each OR gate to a fixed number. Typically, each OR gate receives input of product terms from eight AND gates.

An improvement to PALs provides hardwired OR gates but varies the number of AND gates hardwired to each OR gate so that a variety of functions having different numbers of product terms are available in the array. This type of product is called a programmable logic device (PLD). A PLD offers more options than do PALs but tends to under utilize devices since the average number of product terms connected to any OR gate output is three in typical applications.

Another enhancement is called product term allocation. Product term allocation allows some of the product terms which are inputs to the OR gates to be programmably switched between adjacent OR gates. This allows the numbers of inputs to any OR gate to be increased by a fixed number of input lines and increases the utilization of devices.

However, as computer designs improve, it has become desirable to increase the number of outputs and hence the number of inputs available to programmable logic arrays. As a larger number of input terminals is used, the size of the array increases dramatically. This occurs because there is a relatively constant ratio between the number of inputs and outputs in an array which provides optimum performance. Consequently, as the block grows larger, both the number of inputs and outputs increases in a relatively constant ratio. On the other hand, in typical applications the number of input signals which produce any product term averages about six; and the average number of product terms for each OR gate is from three to four. The result of an attempt to increase the number of inputs to the array is that the number of inputs available to an AND gate increases, and the array slows down in operation because of its complicated construction.

It would be desirable to be able to increase the number of inputs available to a programmable logic circuit without significantly slowing the operational response of the circuit.

SUMMARY OF THE INVENTION

It is, therefore, an object of the present invention to provide a programmable logic circuit for a computer system which is capable of handling a large number of input signals without significantly slowing the speed of the circuit.

It is another more specific object of the present invention to provide a programmable logic circuit capable of handling a larger number of input signals without increasing the number of input signals available to be connected to any input to any AND gate providing a product term.

These and other objects of the present invention are realized in a programmable logic circuit in which each of a first plurality of input conductors may be programmably joined to a first plurality of output conductors and to a first plurality of AND gates, a second plurality of input conductors may be programmably joined to a second plurality of output conductors and to a second plurality of AND gates, dual function means which may be selected to perform either an AND or an OR function are connected to receive input signals from one of the first plurality of AND gates and one of the second plurality of AND gates, and a plurality of OR gates are connected to receive input signals from a selected number of the dual function means. Such an arrangements allows the number of inputs to a particular product term to be kept low thereby shortening the input path of each product term while allowing the number of inputs to be doubled to a particular product term by using the dual function means as an AND gate.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION

Figure 1:
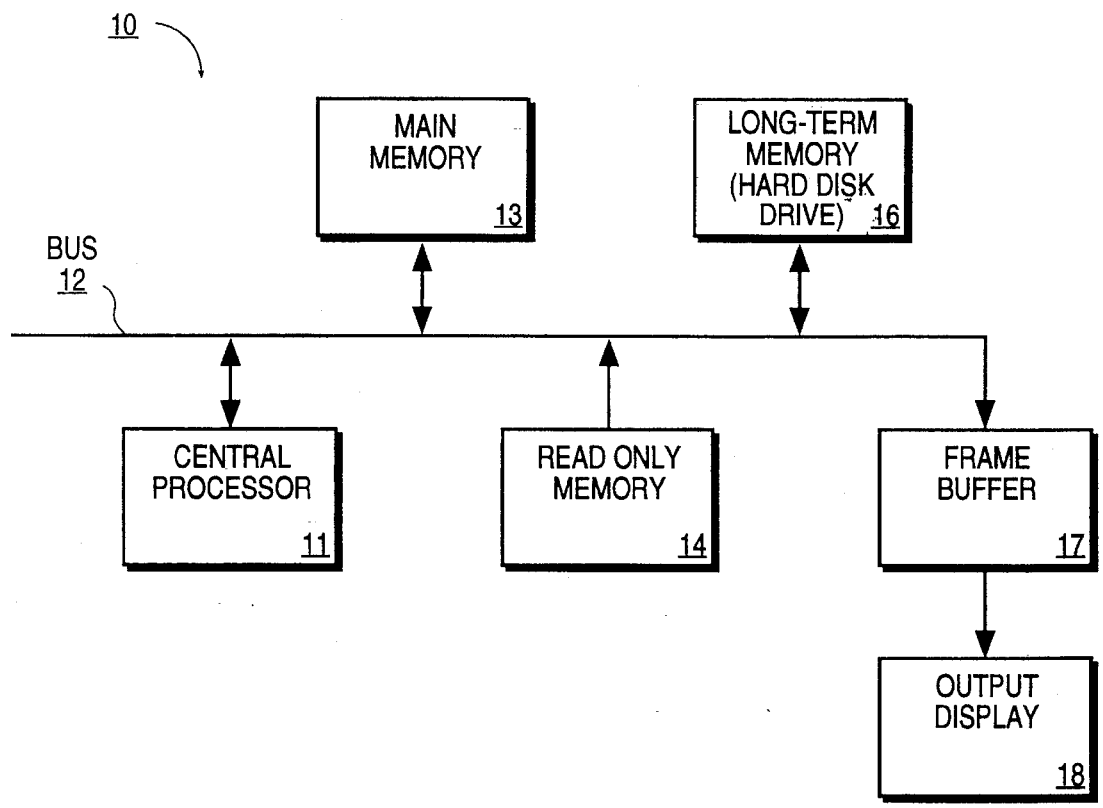
FIG. 1 is a block diagram of a computer system including the present invention.

Referring now to FIG. 1, there is illustrated a computer system 10. The system 10 includes a central processing unit 11 which carries out the various instructions provided to the computer system 10 for its operations. The central processing unit 11 is joined to a bus 12 adapted to carry information to various components of the system 10. Joined to the bus 12 is main memory 13 which is typically constructed of dynamic random access memory arranged in a manner well known to those skilled in the prior art to store information during the period in which power is provided to the system 10. Also joined to the bus 12 is read only memory 14 which may include various memory devices (such as electrically programmable read only memory devices (EPROM devices)) well known to those skilled in the art which are adapted to retain a memory condition in the absence of power to the system 10. The read only memory 14 typically stores various basic functions used by the central processing unit 11 such as basic input output processes and startup processes.

Also connected to the bus 12 are various peripheral components such as long term memory 16. The construction and operation of long term memory 16 (typically electromechanical hard disk drives) is well known to those skilled in the art. Also joined to the bus 12 is circuitry such as a frame buffer 17 to which data may be written which is to be transferred to an output device such as a monitor 18 for display. For the purposes of the present explanation, the frame buffer may be considered to include in addition to various memory planes necessary to store information, various circuitry well known to those skilled in the art such as digital to analog converter circuitry and circuitry for controlling the scan of information to the output display.

Figure 2:
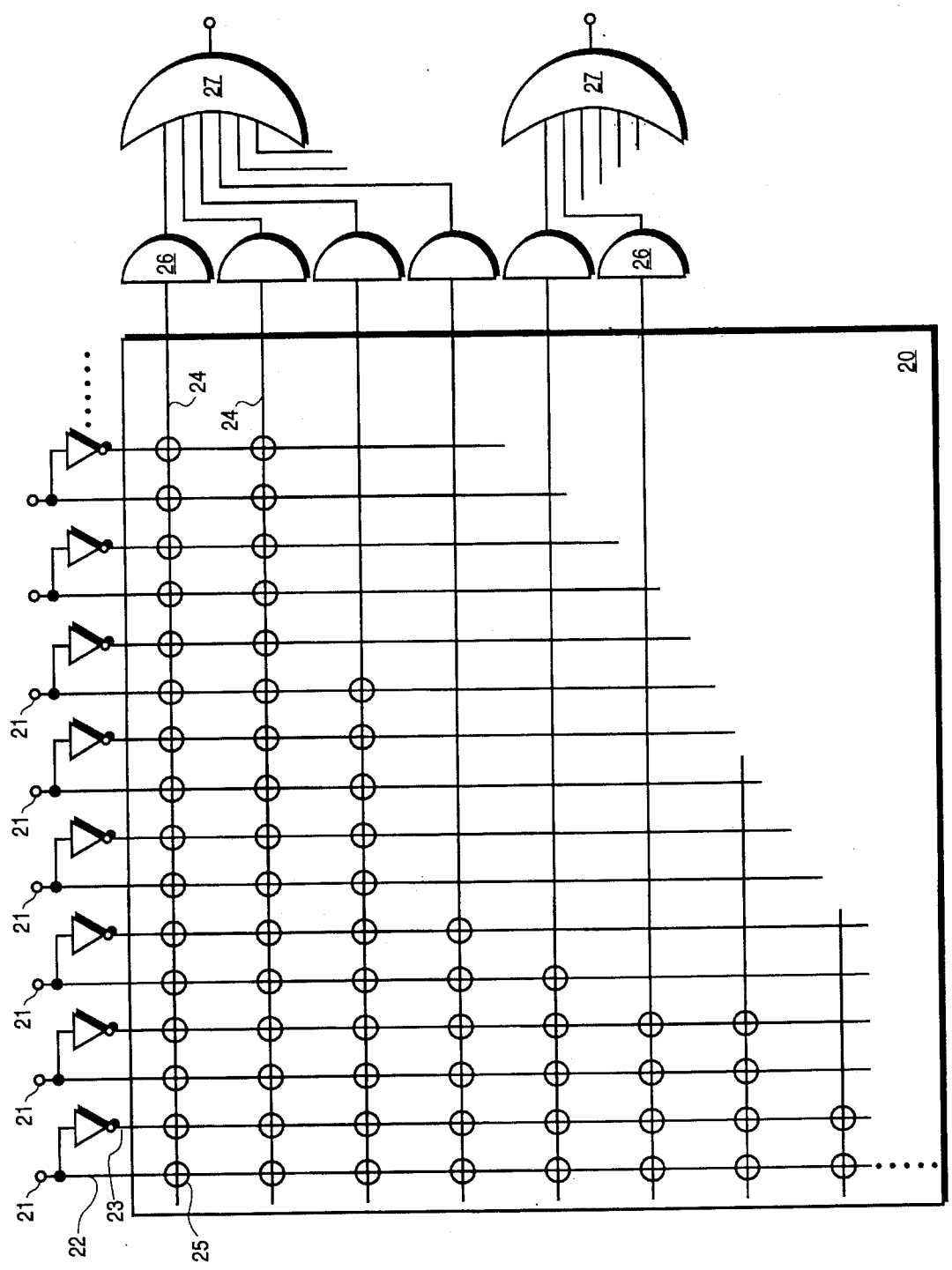
FIG. 2 is a circuit diagram illustrating a prior art programmable logic circuit.

Referring now to FIG. 2, there is illustrated a programmable logic circuit 20 constructed in accordance with the teachings of the prior art. Such a circuit 20 may be used, for example, to provide the decoding function in the instruction decoding portion of a central processing unit 11 shown in FIG. 1. Such a decoding function reduces each instruction furnished to a set of output signals which produce a certain operation to be executed by the central processing unit of a computer. A programmable logic circuit may also be utilized to accomplish various address decoding in a manner well known to those skilled in the art. For example, one programmable logic circuit may be utilized to select the word lines and another programmable logic circuit may be utilized to select the bit lines in a memory array such as the read only memory 14 illustrated in FIG. 1. In a similar manner, a circuit designed in accordance with the present invention may be utilized to provide a programmable means for furnishing any other logic function for which the particular circuit provides a sufficient number of input and output terminals.

The particular circuit 20 illustrated in FIG. 2 has a plurality of input signals provided as inputs at input terminals 21 associated with the circuit. From each input terminal 21, a first conductor 22 traverses the circuit (vertically in FIG. 2) to carry the signal presented while a second conductor 23 traverses the circuit 20 to carry the inverse of the signal presented. Each of these conductors 22 and 23 may be connected through a programmable device represented by a circle 25 in the figure to any of a series of conductors 24. All of the conductors 24 are connected as inputs to a plurality of AND gates 26. In this manner, any input value or its inverse may be ANDed with any other input value or its inverse. Since an AND gate provides a product of the input signals, the output of such an AND gate is typically referred to as a "product term." The output signals produced by a number of these AND gates 26 are furnished to a plurality of OR gates 27 each of which produces an output value. In a PLA, all of the AND circuit outputs are available to each OR gate while in a PAL, typically eight AND gate outputs are hardwired to the input terminals of an OR gate. In contrast in a PLD, the number of inputs hardwired to any OR gate varies in the circuit; one OR gate may receive eight inputs, the next ten inputs, the next twelve inputs, and so on, with the sequence often repeating. Finally, with product term allocation, certain of the product terms may be switched between OR gates. Since any Boolean logic term may be reduced to an AND and an OR function, any such circuit is able to produce any desired Boolean operation if its programmable devices are appropriately programmed.

As will be understood, in any of these circuit arrangements, the attempt to increase the number of output signals increases the number of input signals if the ratio of inputs to outputs is to remain relatively constant. Thus, an attempt to increase the size of these circuits typically increases the number of devices used and the die size by the product of the inputs and outputs. Moreover, even the most advanced of these circuits still drastically under utilize the product terms in the arrangement.

Figure 3:
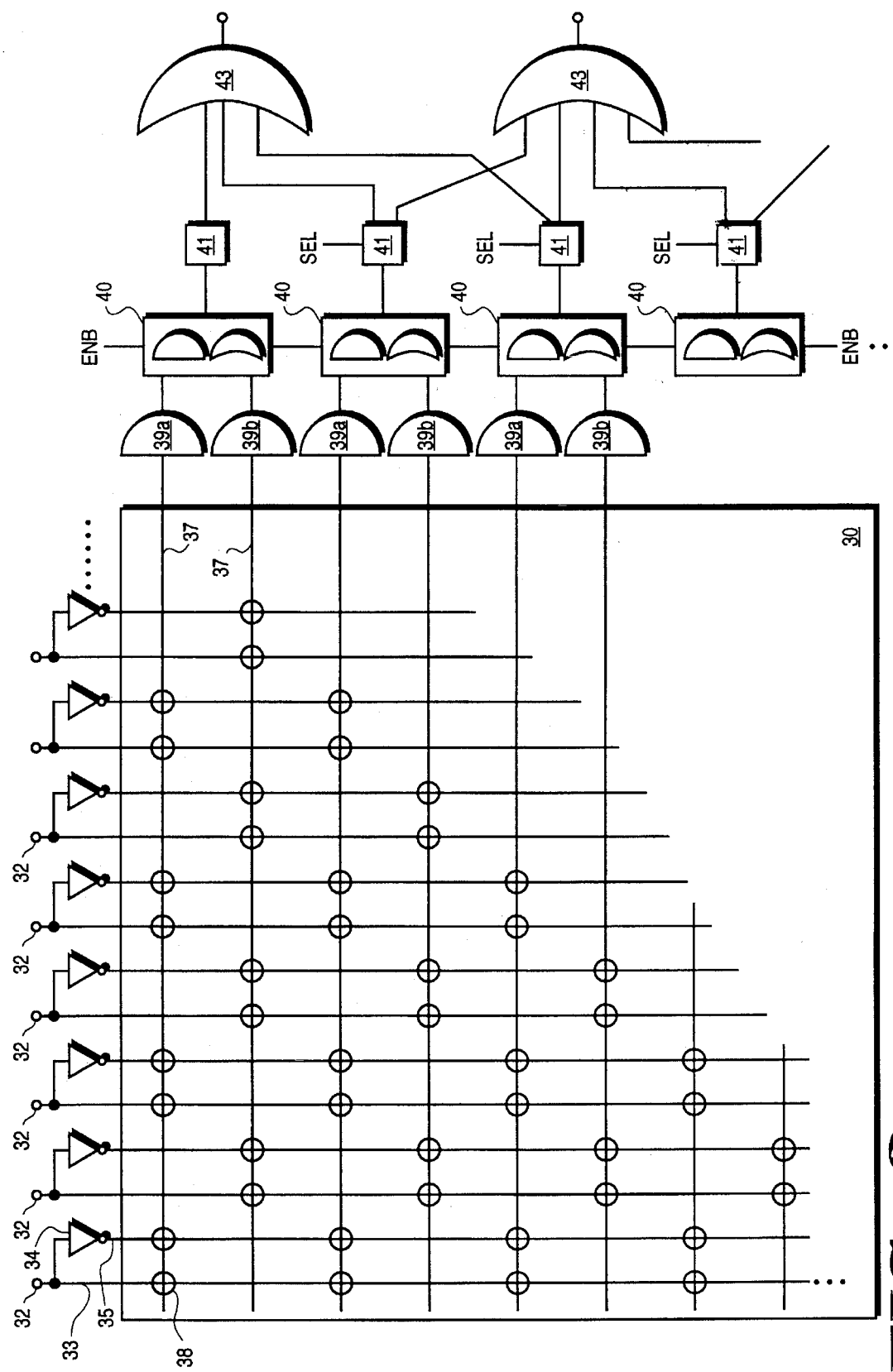
FIG. 3 is a circuit diagram illustrating a programmable array designed in accordance with the present invention.
Figure 5:
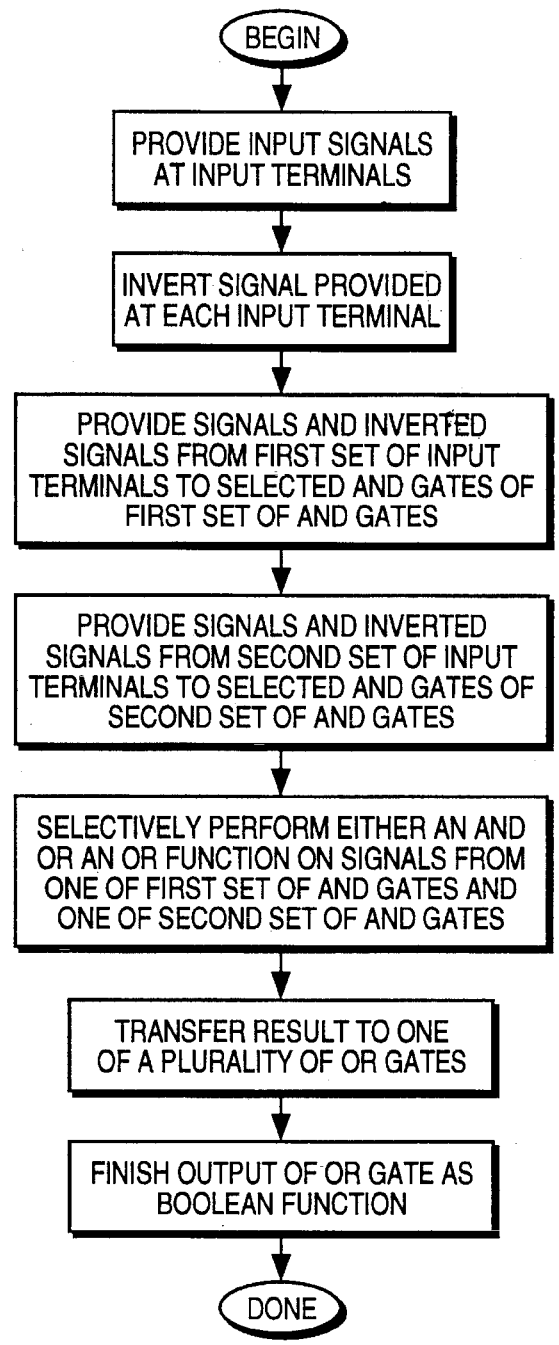
FIG. 5 is a flow chart illustrating a method in accordance with the present invention.

Referring now to FIG. 3, there is illustrated a programmable circuit 30 for carrying out Boolean logic function in accordance with the present invention. The method utilized by the circuit 30 is illustrated in FIG. 5. The circuit 30 allows a great increase in the number of input and output signals while increasing the number of devices used and the die size only incrementally. Moreover, the circuit 30 provides at least some increase in speed of operation over programmable logic circuits of the prior art.

The circuit 30 includes a plurality of input terminals 32. Each input terminal is joined to a conductor 33 which carries the value of the signal placed on the terminal 32 to which the conductor 33 is connected. Each terminal 32 is also connected through an inverter 34 to a second conductor 35 which therefore carries the inverted value of the signal which appears at the input terminal 32 to which the conductor 35 is connected. Illustrated as running perpendicular to the conductors 33 and 35 in the figure are a plurality of additional conductors 37.

In prior art programmable logic circuits, all of the input terminals 32 could be connected to all of these horizontal conductors 37 to furnish input signals to each of the AND gates used to generate product terms. In the present case, each of the input terminals 32 may be connected through the associated input conductors 33 and 35 to only half of the conductors 37 through connections made by programmable devices represented at 38. Half of the conductors 37 are then connected to provide input to one of a pair of AND gates 39(a) and 39(b). The other half of the conductors 37 are connected to provide input to the other of the pair of AND gates 39(a) and 39(b). For example, the first, third, fifth and other odd numbered conductors 33 and the first, third, fifth and other odd numbered conductors 35 (and so on) may be joined to the conductors 37 which provide input to the AND gate 39(a). The even numbered conductors 33 and 35 may, however, be connected to provide input to the AND gate 39(b). Thus, in this embodiment of the present arrangement which includes thirty-six input terminals and sixteen output terminals, only eighteen input terminals may be connected to any AND gate 39(a) or (b). The two AND gates 39(a) and 39 (b) of each pair furnish a pair of product term signals as input to a gate 40. The gate 40 may be caused to function as either an AND or an OR gate through the use of a programmable enable signal. Such a gate 40 may include separate AND and OR gates which may be individually selected by the programmable enable signal. By selecting the AND gate function of the gate 40, a product term of all thirty-six input values may be generated. By selecting the OR gate function of the gate 40, the OR result of two eighteen input product terms is available from the gate 40. This reduces in half the number of devices necessary to make the programmable connections to the horizontal conductors 37 and maintains the size of the die quite small while increasing both the number of input terminals (and signals) and output terminals available. This reduction in the number of devices and the physical size of the die has the effect of maintaining the speed of operation of the circuit 30 even though the number of input and output terminals available have drastically increased.

Figure 4:
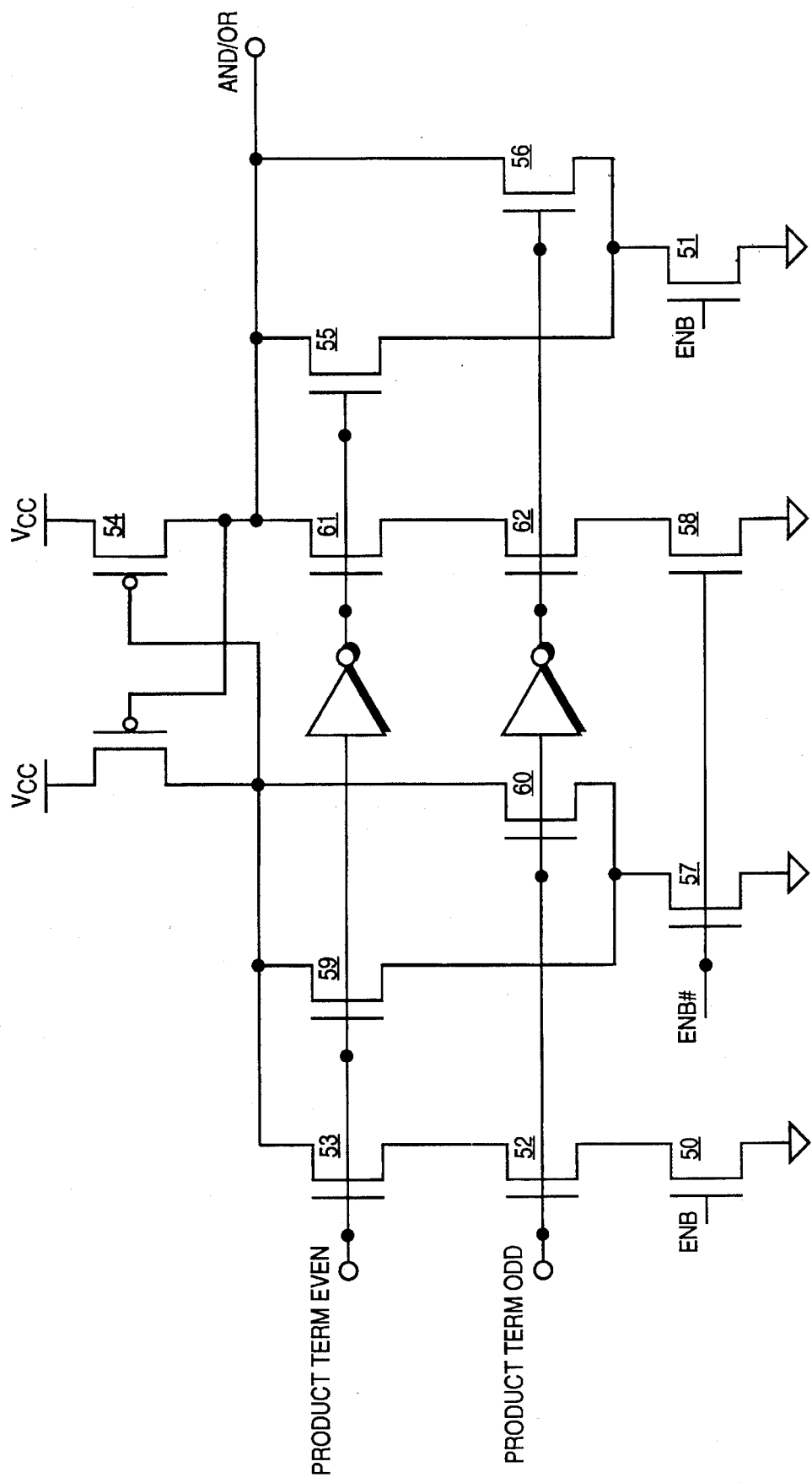
FIG. 4 is a circuit diagram illustrating in detail a portion of the circuit shown in FIG. 3.

FIG. 4 illustrates an alternative circuit which may be used instead of individual AND and OR gates for the dual purpose gate 40. In this arrangement, when an enabling signal ENB is high and ENB# is low, a pair of N channel devices 50 and 51 are turned on and the circuit operates as an AND gate. As may be seen, the path is provided through a pair of N channel devices 52 and 53 when both product terms are high to furnish ground at the gate of a P channel device 54 and a high value (Vcc) at an output terminal; a low value on either product term causes one of N channel devices 55 or 56 to provide ground at the output. Alternatively, when the ENB# signal is high and ENB is low, a pair of N channel devices 57 and 58 are turned on; and the circuit operates as an OR gate. The device 57 provides a path from ground through either or both of a pair of N channel devices 59 and 60 to the gate of the device 54 when either or both product term presents a high value. This causes a high output to occur at the output terminal; a low value on both product terms causes a pair of N channel devices 61 and 62 to provide ground at the output terminal.

In the basic array of the invention, the output signals from two sets of the gates 40 are provided as inputs to each one of a set of OR gates 43. This allows each OR gate 43 to receive input from two product terms of thirty-six possible inputs or from four product terms each having eighteen possible inputs. This provides a reasonable number of input terms of when product terms of eighteen inputs are utilized by selecting the OR function of the gates 40 since the average number of product terms which provide input to an OR gate in a typical programmable array is only three or four. Moreover, in particular embodiments of the circuit (and as is shown in FIG. 3), some number of the product terms provided by the gates 40 may be switched from the OR gate 43 to which they would normally be furnished and provided to an adjacent one of the OR gates 43. This may be accomplished through the use of a switch 41 at the output of the gate 40 which may be programmed to allow any of the product terms to be switched to the next adjacent OR gate. This allows the arrangement to OR more product terms than the basic arrangement provides. For example, assuming that each of the gates 40 providing input to a particular gate 43 is used in its AND gate mode and that each of the adjacent product terms normally providing input to the OR gates 43 above and below are switched to the .particular OR gate 43, then a total of four product terms each capable of receiving thirty-six input signals is provided to the OR gate 43. Alternatively, assuming that each of the gates 40 providing input to a particular gate 43 is used in its OR gate mode and that each of the adjacent product terms normally providing input to the OR gates 43 above and below are switched to the particular OR gate 43, then a total of eight product terms each capable of receiving eighteen input signals is provided to the particular OR gate 43.

The result of all this manipulation is that expandable product terms are provided each of which can handle up to thirty-six input signals while the number of devices is kept low. Moreover, the actual number of inputs to any individual AND gate remains the same; and the speed of the arrangement is maintained. Further, since the average number of inputs to a product term remains constant typically at about five, each individual AND gate 39(a) or 39(b) is of a size sufficient to handle those inputs efficiently. Because each input terminal 32 is connectable to only half of the conductors 37, the number of the programmable connections from the input terminals 32 to the conductors 37 is cut in half. As is well known to those skilled in the art, a number of devices is actually required to make each of the programmable connections so this results in a substantial saving in device number and die size. In one embodiment with thirty-six input terminals and sixteen output terminals, the overall result is that with only a ten percent increase in the size of the die, a sixty percent increase in the number of output signals may be realized.

In addition to these advantages, the arrangement illustrated is actually faster in operation than is prior art arrangement providing a smaller number of input and output signals. This occurs because each input terminal is connected to only half as many of the conductors 37 thereby reducing the complexity of the logic and the number of delays in each AND gate.

Of course, those skilled in the art will also recognize that the ratio at which the input terminals are connected to the input lines leading to the AND gates may also be varied. For example, a particular input terminal might be connected in a particular embodiment to only one in four of the AND gate input terminals and then four AND gates (such as 39) might be ANDed or ORed by a second gate (such as 40) to provide a wider selection of input values to a product term. Similarly, other ratios of input terminals to AND input lines might be utilized to provide the results of the present invention.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A programmable logic circuit comprising:

(a) a plurality of sets of first conductors;

(b) a plurality of sets of second conductors;

(c) a plurality of sets of programmable devices, each set of the plurality of sets of programmable devices coupled to a corresponding set of the plurality of sets of first conductors and coupled to a corresponding set of the plurality of sets of second conductors for selectively coupling the corresponding set of the plurality of sets of first conductors to the corresponding set of the plurality of sets of second conductors, wherein each set of the plurality of sets of first conductors is coupled to only one set of programmable devices and wherein each set of the plurality of sets of second conductors is coupled to only one set of programmable devices;

(d) a plurality of sets of AND gates, each set of the plurality of sets of AND gates coupled to a corresponding set of the plurality of sets of second conductors and each AND gate of the plurality of sets of AND gates for outputting a first output signal; and (e) at least one multiple-function gate, each of the at least one multiple-function gate coupled to receive the first output signal from at least two corresponding AND gates of the plurality of sets of AND gates for performing a selected function using the first output signal from the at least two corresponding AND gates to produce a second output signal.

2. The programmable logic circuit of claim 1, wherein each set of the plurality of sets of programmable devices is coupled to 1/Nth of the plurality of sets of first conductors, wherein N is a positive integer greater than or equal to two.

3. The programmable logic circuit of claim 1, wherein the at least one multiple-function gate comprises a plurality of multiple-function gates, and wherein the programmable logic circuit comprises:

(f) a plurality of OR gates, each OR gate of the plurality of OR gates for receiving the second output signal from at least two corresponding multiple-function gates of the plurality of multiple-function gates to produce a third output signal.

4. The programmable logic circuit of claim 3, comprising:

(g) a plurality of switches coupled between the plurality of multiple-function gates and the plurality of OR gates, each switch of the plurality of switches for coupling the second output signal from a corresponding one of the plurality of multiple-function gates to one of the plurality of OR gates.

5. The programmable logic circuit of claim 1, each of the at least one multiple-function gate for selectively performing an AND function or an OR function using the first output signal from the at least two corresponding AND gates to produce the second output signal.

6. The programmable logic circuit of claim 5, wherein each of the at least one multiple-function gate comprises an AND gate for performing the AND function, an OR gate for performing the OR function, and a selector circuit for selecting either the AND function or the OR function.

7. The programmable logic circuit of claim 5, wherein each of the at least one multiple-function gate comprises a gate for providing either the AND function or the OR function and a selector circuit for selecting either the AND function or the OR function.

8. A computer system comprising:

(a) a processor;

(b) a memory coupled to the processor; and (c) a programmable logic circuit coupled to the processor, the programmable logic circuit comprising:

(i) a plurality of sets of first conductors, (ii) a plurality of sets of second conductors, (iii) a plurality of sets of programmable devices, each set of the plurality of sets of programmable devices coupled to a corresponding set of the plurality of sets of first conductors and coupled to a corresponding set of the plurality of sets of second conductors for selectively coupling the corresponding set of the plurality of sets of first conductors to the corresponding set of the plurality of sets of second conductors, wherein each set of the plurality of sets of first conductors is coupled to only one set of programmable devices and wherein each set of the plurality of sets of second conductors is coupled to only one set of programmable devices, (iv) a plurality of sets of AND gates, each set of the plurality of sets of AND gates coupled to a corresponding set of the plurality of sets of second conductors and each AND gate of the plurality of sets of AND gates for outputting a first output signal, and (v) at least one multiple-function gate, each of the at least one multiple-function gate coupled to receive the first output signal from at least two corresponding AND gates of the plurality of sets of AND gates for performing a selected function using the first output signal from the at least two corresponding AND gates to produce a second output signal.

9. The computer system of claim 8, wherein the processor includes the programmable logic circuit.

10. The computer system of claim 8, wherein each set of the plurality of sets of programmable devices is coupled to 1/Nth of the plurality of sets of first conductors, wherein N is a positive integer greater than or equal to two.

11. The computer system of claim 8, wherein the at least one multiple-function gate comprises a plurality of multiple-function gates, and wherein the programmable logic circuit comprises:

(vi) a plurality of OR gates, each OR gate of the plurality of OR gates for receiving the second output signal from at least two corresponding multiple-function gates of the plurality of multiple-function gates to produce a third output signal.

12. The computer system of claim 11, comprising:

(vii) a plurality of switches coupled between the plurality of multiple-function gates and the plurality of OR gates, each switch of the plurality of switches for coupling the second output signal from a corresponding one of the plurality of multiple-function gates to one of the plurality of OR gates.

13. The computer system of claim 8, each of the at least one multiple-function gate for selectively performing an AND function or an OR function using the first output signal from the at least two corresponding AND gates to produce the second output signal.

14. The computer system of claim 13, wherein each of the at least one multiple-function gate comprises an AND gate for performing the AND function, an OR gate for performing the OR function, and a selector circuit for selecting either the AND function or the OR function.

15. The computer system of claim 13, wherein each of the at least one multiple-function gate comprises a gate for providing either the AND function or the OR function and a selector circuit for selecting either the AND function or the OR function.

16. A programmable logic circuit comprising:

(a) a plurality of sets of first conductors;

(b) a plurality of sets of second conductors;

(c) a plurality of sets of programmable means, each set of the plurality of sets of programmable means coupled to a corresponding set of the plurality of sets of first conductors and coupled to a corresponding set of the plurality of sets of second conductors for selectively coupling the corresponding set of the plurality of sets of first conductors to the corresponding set of the plurality of sets of second conductors, wherein each set of the plurality of sets of first conductors is coupled to only one set of programmable means and wherein each set of the plurality of sets of second conductors is coupled to only one set of programmable means;

(d) a plurality of sets of AND means, each set of the plurality of sets of AND means coupled to a corresponding set of the plurality of sets of second conductors and each AND means of the plurality of sets of AND means for outputting a first output signal; and (e) at least one multiple-function means, each of the at least one multiple-function means coupled to receive the first output signal from at least two corresponding AND means of the plurality of sets of AND means for performing a selected function using the first output signal from the at least two corresponding AND means to produce a second output signal.

17. The programmable logic circuit of claim 16, wherein each set of the plurality of sets of programmable means is coupled to 1/Nth of the plurality of sets of first conductors, wherein N is a positive integer greater than or equal to two.

18. The programmable logic circuit of claim 16, wherein the at least one multiple-function means comprises a plurality of multiple-function means, and wherein the programmable logic circuit comprises:

(f) a plurality of OR means, each OR means of the plurality of OR means for receiving the second output signal from at least two corresponding multiple-function means of the plurality of multiple-function means to produce a third output signal.

19. The programmable logic circuit of claim 18, comprising:

(g) a plurality of switch means coupled between the plurality of multiple-function means and the plurality of OR means, each switch means of the plurality of switch means for coupling the second output signal from a corresponding one of the plurality of multiple-function means to one of the plurality of OR means.

20. The programmable logic circuit of claim 16, each of the at least one multiple-function means for selectively performing an AND function or an OR function using the first output signal from the at least two corresponding AND means to produce the second output signal.

21. The programmable logic circuit of claim 20, wherein each of the at least one multiple-function means comprises an AND gate for performing the AND function, an OR gate for performing the OR function, and a selector circuit for selecting either the AND function or the OR function.

22. The programmable logic circuit of claim 20, wherein each of the at least one multiple-function gate comprises a gate for providing either the AND function or the OR function and a selector circuit for selecting either the AND function or the OR function.

23. A computer system comprising:

(a) a processor;

(b) a memory coupled to the processor; and (c) a programmable logic circuit coupled to the processor, the programmable logic circuit comprising:

(i) a plurality of sets of first conductors, (ii) a plurality of sets of second conductors, (iii) a plurality of sets of programmable means, each set of the plurality of sets of programmable means coupled to a corresponding set of the plurality of sets of first conductors and coupled to a corresponding set of the plurality of sets of second conductors for selectively coupling the corresponding set of the plurality of sets of first conductors to the corresponding set of the plurality of sets of second conductors, wherein each set of the plurality of sets of first conductors is coupled to only one set of programmable means and wherein each set of the plurality of sets of second conductors is coupled to only one set of programmable means, (iv) a plurality of sets of AND means, each set of the plurality of sets of AND means coupled to a corresponding set of the plurality of sets of second conductors and each AND means of the plurality of sets of AND means for outputting a first output signal, and (v) at least one multiple-function means, each of the at least one multiple-function means coupled to receive the first output signal from at least two corresponding AND means of the plurality of sets of AND means for performing a selected function using the first output signal from the at least two corresponding AND means to produce a second output signal.

24. The computer system of claim 23, wherein the processor includes the programmable logic circuit.

25. The computer system of claim 23, wherein each set of the plurality of sets of programmable means is coupled to 1/Nth of the plurality of sets of first conductors, wherein N is a positive integer greater than or equal to two.

26. The computer system of claim 23, wherein the at least one multiple-function means comprises a plurality of multiple-function means, and wherein the programmable logic circuit comprises:

(vi) a plurality of OR means, each OR means of the plurality of OR means for receiving the second output signal from at least two corresponding multiple-function means of the plurality of multiple-function means to produce a third output signal.

27. The computer system of claim 26, comprising:

(vii) a plurality of switch means coupled between the plurality of multiple-function means and the plurality of OR means, each switch means of the plurality of switch means for coupling the second output signal from a corresponding one of the plurality of multiple-function means to one of the plurality of OR means.

28. The computer system of claim 23, each of the at least one multiple-function means for selectively performing an AND function or an OR function using the first output signal from the at least two corresponding AND means to produce the second output signal.

29. The computer system of claim 28, wherein each of the at least one multiple-function means comprises an AND gate for performing the AND function, an OR gate for performing the OR function, and a selector circuit for selecting either the AND function or the OR function.

30. The computer system of claim 28, wherein each of the at least one multiple-function means comprises a gate for providing either the AND function or the OR function and a selector circuit for selecting either the AND function or the OR function.

31. A programmable logic circuit comprising:
  (a) a plurality of first conductors;
  (b) a plurality of second conductors;
  (c) a plurality of programmable devices, each of the plurality of programmable devices coupled to a corresponding one of the plurality of first conductors and coupled to a corresponding one of the plurality of second conductors for selectively coupling the corresponding one first conductor to the corresponding one second conductor;
  (d) a plurality of AND gates coupled to the plurality of second conductors, each AND gate of the plurality of AND gates for outputting a first output signal;
  (e) a plurality of multiple-function gates, each of the plurality of multiple-function gates coupled to receive the first output signal from at least two corresponding AND gates of the plurality of AND gates for performing a selected function using the first output signal from the at least two corresponding AND gates to produce a second output signal;
  (f) a plurality of OR gates, each OR gate of the plurality of OR gates for receiving the second output signal from at least two corresponding multiple-function gates of the plurality of multiple-function gates to produce a third output signal; and
  (g) a plurality of switches coupled between the plurality of multiple-function gates and the plurality of OR gates, each switch of the plurality of switches for coupling the second output signal from a corresponding one of the plurality of multiple-function gates to one of the plurality of OR gates.

32. The programmable logic circuit of claim 31, each of the plurality of multiple-function gates for selectively performing an AND function or an OR function using the first output signal from the at least two corresponding AND gates to produce the second output signal.

33. The programmable logic circuit of claim 32, wherein each of the plurality of multiple-function gates comprises an AND gate for performing the AND function, an OR gate for performing the OR function, and a selector circuit for selecting either the AND function or the OR function.

34. The programmable logic circuit of claim 32, wherein each of the plurality of multiple-function gates comprises a gate for providing either the AND function or the OR function and a selector circuit for selecting either the AND function or the OR function.

35. A computer system comprising:
  (a) a processor;
  (b) a memory coupled to the processor; and
  (c) a programmable logic circuit coupled to the processor, the programmable logic circuit comprising:
    (i) a plurality of first conductors,
    (ii) a plurality of second conductors,
    (iii) a plurality of programmable devices, each of the plurality of programmable devices coupled to a corresponding one of the plurality of first conductors and coupled to a corresponding one of the plurality of second conductors for selectively coupling the corresponding one first conductor to the corresponding one second conductor,
    (iv) a plurality of AND gates coupled to the plurality of second conductors, each AND gate of the plurality of AND gates for outputting a first output signal,
    (v) a plurality of multiple-function gates, each of the plurality of multiple-function gates coupled to receive the first output signal from at least two corresponding AND gates of the plurality of AND gates for performing a selected function using the first output signal from the at least two corresponding AND gates to produce a second output signal,
    (vi) a plurality of OR gates, each OR gate of the plurality of OR gates for receiving the second output signal from at least two corresponding multiple-function gates of the plurality of multiple-function gates to produce a third output signal, and
    (vii) a plurality of switches coupled between the plurality of multiple-function gates and the plurality of OR gates, each switch of the plurality of switches for coupling the second output signal from a corresponding one of the plurality of multiple-function gates to one of the plurality of OR gates.

36. The computer system of claim 35, wherein the processor includes the programmable logic circuit.

37. The computer system of claim 35, each of the plurality of multiple-function gates for selectively performing an AND function or an OR function using the first output signal from the at least two corresponding AND gates to produce the second output signal.

38. The computer system of claim 37, wherein each of the plurality of multiple-function gates comprises an AND gate for performing the AND function, an OR gate for performing the OR function, and a selector circuit for selecting either the AND function or the OR function.

39. The computer system of claim 37, wherein each of the plurality of multiple-function gates comprises a gate for providing either the AND function or the OR function and a selector circuit for selecting either the AND function or the OR function.

* * * * *